(12) United States Patent
Han (10) Patent No.: US 10,354,592 B2
(45) Date of Patent: Jul. 16, 2019

(54) AMOLED PIXEL DRIVER CIRCUIT (71) Applicant: Shenzhen China Star Optoelectronics Semiconductor Display Technology Co., Ltd., Shenzhen (CN)

(72) Inventor: Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 62 days.

(21) Appl. No.: 15/580,277

(22) PCT Filed: Nov. 16, 2017

(86) PCT No.: PCT/CN2017/111335
§ 371 (c)(1),
(2) Date: Dec. 7, 2017

(87) PCT Pub. No.: WO2019/037300
PCT Pub. Date: Feb. 28, 2019

(65) Prior Publication Data
US 2019/0066587 A1 Feb. 28, 2019

(30) Foreign Application Priority Data

Aug. 22, 2017 (CN) .......................... 2017 1 0726140

(51) Int. Cl.
*G09G 3/3258* (2016.01)
*H01L 27/12* (2006.01)
(Continued)

(52) U.S. Cl.
CPC ......... *G09G 3/3258* (2013.01); *G09G 3/3233* (2013.01); *H01L 27/1218* (2013.01);
(Continued)

(58) Field of Classification Search
CPC ... G09G 2300/0819; G09G 2300/0842; G09G 2300/0866; G09G 2310/0262;
(Continued)

(56) References Cited

U.S. PATENT DOCUMENTS 9,087,483 B2 * 7/2015 Kim ..................... G09G 3/3266
2013/0147690 A1 * 6/2013 Kim ..................... G09G 3/3233
345/76

(Continued)

FOREIGN PATENT DOCUMENTS

CN 101667391 A 3/2010
CN 105741779 A 7/2016
(Continued)

*Primary Examiner* — Afroza Chowdhury
(74) *Attorney, Agent, or Firm* — Leong C. Lei (57) ABSTRACT

The invention provides an AMOLED pixel driver circuit, comprising: first TFT (T1), with top gate connected to first node (G), bottom gate connected to second node (B), source and drain connected respectively to high voltage power source (VDD) and third node (S); second TFT (T2), with gate connected to scan line (Scan), source and drain connected respectively to first node (G) and first data line (Data1); third TFT (T3), with gate connected to scan line (Scan), source and drain connected respectively to sense signal line (Sense) and third node (S); fourth TFT (T4), with gate connected to scan line (Scan), source and drain connected respectively to second node (B) and second data line (Data2); first capacitor (C), connected to second node (B) and high voltage power source (VDD); second capacitor Cst, connected to first node (G) and third node (S); OLED (D1), with anode connected to third node (S).

14 Claims, 4 Drawing Sheets (51) Int. Cl.
*H01L 27/32* (2006.01)
*G09G 3/3233* (2016.01)
(52) U.S. Cl.
CPC . *H01L 27/3276* (2013.01); *G09G 2300/0819* (2013.01); *G09G 2300/0842* (2013.01); *G09G 2300/0866* (2013.01); *G09G 2310/0262* (2013.01); *G09G 2310/0264* (2013.01); *G09G 2320/0285* (2013.01); *G09G 2320/0295* (2013.01); *G09G 2320/043* (2013.01)
(58) Field of Classification Search
CPC ... G09G 2310/0264; G09G 2320/0285; G09G 2320/0295; G09G 2320/043; G09G 3/3233; G09G 3/3258; H01L 27/1218; H01L 27/3276
See application file for complete search history.

(56) References Cited

U.S. PATENT DOCUMENTS

| | | |
|---|---|---|
| 2016/0042694 A1 | 2/2016 | Lim |
| 2016/0260373 A1 | 9/2016 | Miyake |

FOREIGN PATENT DOCUMENTS

| | | |
|---|---|---|
| CN | 106486522 A | 3/2017 |
| CN | 106652910 A | 5/2017 |
| CN | 107316614 A | 11/2017 |

* cited by examiner

|  |  |  |  |  |  |
|--|--|--|--|--|--|
| Vth1 (B1) | Vth2 (B2) | Vth3 (B3) | Vth4 (B4) | Vth5 (B5) | Vth6 (B6) |
| Vth7 (B7) | Vth8 (B8) | Vth9 (B9) | Vth10 (B10) | Vth11 (B11) | Vth12 (B12) |
| Vth13 (B13) | Vth14 (B14) | Vth15 (B15) | Vth16 (B16) | Vth17 (B17) | Vth18 (B18) |
| Vth19 (B19) | Vth20 (B20) | Vth21 (B21) | Vth22 (B22) | Vth23 (B23) | Vth24 (B24) |

AMOLED PIXEL DRIVER CIRCUIT

BACKGROUND OF THE INVENTION

1. Field of the Invention

The present invention relates to the field of display techniques, and in particular to a GOA circuit.

2. The Related Arts

The liquid crystal display (LCD), or LCD panel, provides the advantages of self-luminance, high emission efficiency, high resolution and contrast, near 180° viewing angle, wide operation temperature range, ability to achieve flexible display and large-area full-color display, and is heralded as the display device with most potential. The driving types of OLED can be divided, according to the driving method, into the passive matrix OLED (PMOLED) and active matrix OLED (AMOLED); wherein the AMOLED provides the advantages of pixels arranged in an array, self-luminous, and high luminous efficiency and is commonly used for high definition large-size display.

AMOLED is a current-driven device and the light-emitting luminance is determined by the current flowing through the OLED. Most of the known integrated circuits (ICs) only transmit voltage signals, so the AMOLED pixel driver circuit needs to complete the task of converting the voltage signal into a current signal. Therefore, a 2T 1C voltage/current conversion (V/I) circuit is often used.

Figure 1:
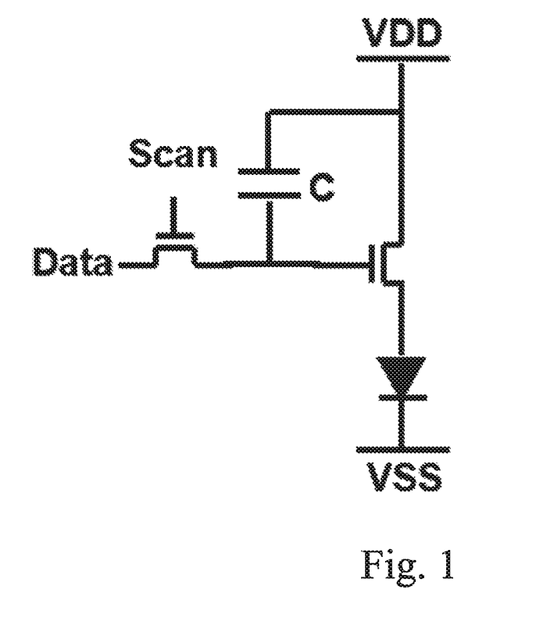
FIG. 1 is a schematic view showing a known 2T1C pixel driver circuit.

As shown in FIG. 1, a known 2T1C pixel driver circuit is shown. The driver circuit comprises two thin film transistors (TFTs) and a capacitor (C) to convert the voltage into current to drive the OLED, wherein one TFT is a switching TFT, controlled by a scan signal Scan, for controlling the entry of data signal Data, and the other TFT is a driving TFT, for driving the OLED and controlling the current flowing through the OLED. The scan signal Scan is from a gate driver, and the data signal Data is from a source driver. Therefore, the importance of the threshold voltage Vth of the driving TFT is obvious. The threshold voltage drifts towards positive or negative will cause different amount of current flowing through the OLED under the same data signal, which affects the panel brightness uniformity. However, the TFTs made by the low temperature polysilicon (LTPS) or oxide semiconductor always encounter threshold voltage drift during use due to various factors.

A simple design of pixel driver circuit as shown in FIG. 1 is sensitive to the threshold voltage, channel migration rate, OLED activation voltage, quantum efficiency and instant change process of the power source. Using the 2T1C pixel circuit without compensation, the brightness unevenness of the AMOLED is about 50%, or higher.

So solve the unevenness, an approach is to add a compensation circuit to each pixel. The compensation means to compensate the parameters (such as, threshold voltage and migration rate) of the driving TFT in each pixel so that the output current is independent of these parameters.

SUMMARY OF THE INVENTION

The object of the present invention is to provide an AMOLED pixel driver circuit, able to compensate the electric drift of the driving TFT.

To achieve the above object, the present invention provides an AMOLED pixel driver circuit, comprising:

a first TFT, acting as a driving TFT, with dual-gate structure, a top gate connected to a first node, a bottom gate connected to a second node, and a source and a drain connected respectively to a high voltage power source and a third node;

a second TFT, having a gate connected to a scan line, a source and a drain connected respectively to the first node and a first data line;

a third TFT, having a gate connected to the scan line, a source and a drain connected respectively to a sense signal line and the third node; a fourth TFT, having a gate connected to the scan line, a source and a drain connected respectively to the second node and a second data line;

a first capacitor, having two ends connected respectively to the second node and the high voltage power source;

a second capacitor, having two ends connected respectively to the first node and the third node;

an organic light-emitting diode (OLED), having an anode connected to the third node and a cathode connected to a low voltage power source.

According to a preferred embodiment of the present invention, the first TFT, the second TFT, the third TFT, and the fourth TFT are all low temperature polysilicon (LTPS) TFTs, or oxide semiconductor TFTs.

According to a preferred embodiment of the present invention, when the AMOLED pixel driver circuit operating in a first TFT threshold voltage sense state, the scan line is configured to input a high voltage; the first data line is configured to input a reference voltage; the first TFT threshold voltage sense state is divided into an initialization phase and a threshold voltage generation phase; the sense signal line is configured to input a second reference voltage in the initialization phase, and is configured as floating in the threshold voltage generation phase; the second reference voltage is less than the first reference voltage and is also less than an activation voltage of the OLED; the second data line is configured as a third reference voltage.

According to a preferred embodiment of the present invention, the third reference voltage is 0V.

According to a preferred embodiment of the present invention, in the threshold voltage generation phase, the third node is raised to a voltage level of a difference between the first reference voltage and threshold voltage of the first TFT, the threshold voltage of the first TFT is obtained through the voltage level of the third node, and at this point, the second node has a voltage level of the third reference voltage.

According to a preferred embodiment of the present invention, for all pixels in a panel, the threshold voltage of the first TFT of each pixel in the panel is obtained and stored in a memory.

According to a preferred embodiment of the present invention, a voltage level for the second node required for adjusting the threshold voltage of the first TFT a uniform setting for all pixels in the panel is obtained through corresponding relation between the threshold voltage of the first TFT and the voltage level of the second node; a compensation data is formed based on the voltage level of the second node, and a compensation signal is formed based on the compensation data.

According to a preferred embodiment of the present invention, for all pixels in the panel, the compensation data corresponding to each pixel is respectively obtained.

According to a preferred embodiment of the present invention, when the AMOLED pixel driver circuit operating in a first TFT threshold voltage compensation and light-emitting state, the first TFT threshold voltage compensation and light-emitting state is divided into a compensation phase and a light-emitting phase; the scan line is configured to input a high voltage in the compensation phase, and is configured to input a low voltage in the light-emitting phase; the first data line is configured to input a data signal; the second data line is configured to input the compensation signal; the sense signal line is configured to input a fourth reference voltage, and the fourth reference voltage is less than the activation voltage of the OLED.

The present invention also provides an AMOLED pixel driver circuit, comprising:

a first TFT, acting as a driving TFT, with dual-gate structure, a top gate connected to a first node, a bottom gate connected to a second node, and a source and a drain connected respectively to a high voltage power source and a third node;

a second TFT, having a gate connected to a scan line, a source and a drain connected respectively to the first node and a first data line;

a third TFT, having a gate connected to the scan line, a source and a drain connected respectively to a sense signal line and the third node;

a fourth TFT, having a gate connected to the scan line, a source and a drain connected respectively to the second node and a second data line;

a first capacitor, having two ends connected respectively to the second node and the high voltage power source;

a second capacitor, having two ends connected respectively to the first node and the third node;

an organic light-emitting diode (OLED), having an anode connected to the third node and a cathode connected to a low voltage power source;

wherein the first TFT, the second TFT, the third TFT, and the fourth TFT being all low temperature polysilicon (LTPS) TFTs, or oxide semiconductor TFTs.

wherein when the AMOLED pixel driver circuit operating in a first TFT threshold voltage sense state, the scan line being configured to input a high voltage; the first data line being configured to input a reference voltage; the first TFT threshold voltage sense state being divided into an initialization phase and a threshold voltage generation phase; the sense signal line being configured to input a second reference voltage in the initialization phase, and configured as floating in the threshold voltage generation phase; the second reference voltage being less than the first reference voltage and also less than an activation voltage of the OLED; the second data line being configured as a third reference voltage;

wherein the third reference voltage is 0V;

wherein in the threshold voltage generation phase, the third node being raised to a voltage level of a difference between the first reference voltage and threshold voltage of the first TFT, the threshold voltage of the first TFT being obtained through the voltage level of the third node, and at this point, the second node having a voltage level of the third reference voltage.

In summary, the AMOLED pixel driver circuit of the invention can effectively compensate the electric drift of the driving TFT.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 2:
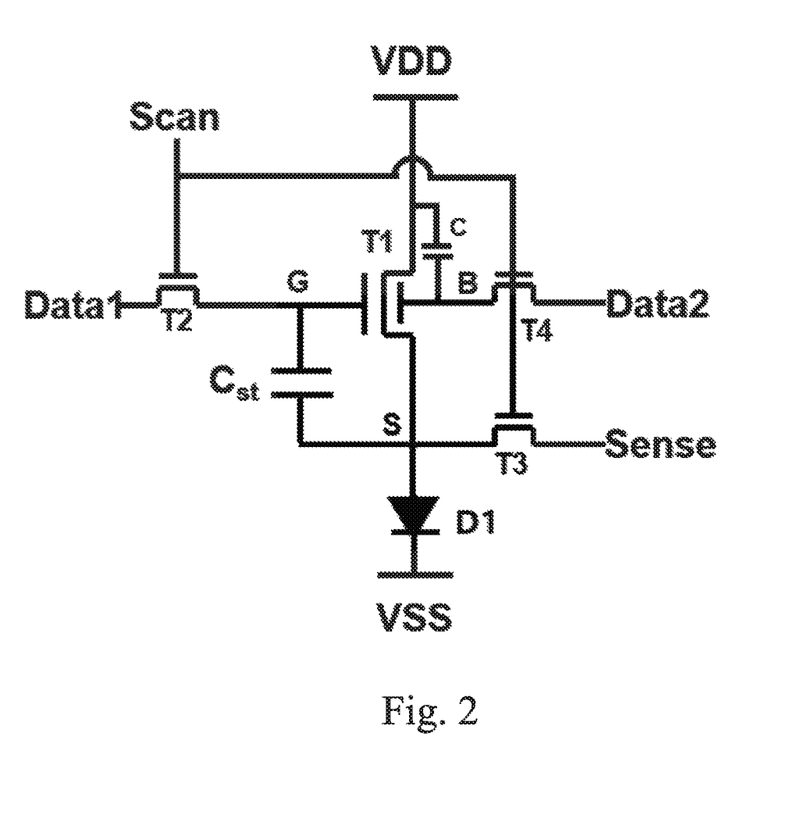
FIG. 2 is a schematic view showing of an AMOLED pixel driver circuit of a preferred embodiment of the present invention.

Refer to FIG. 2. To achieve compensation and driving of a single pixel, the present invention introduces a dual-gate structure to adjust the threshold voltage of the driving TFT. A preferred embodiment of the AMOLED pixel driver circuit of the present invention comprises: a dual-gate TFT T1, serving as a driving TFT, a TFT T2, controlled by the signal of the scan line Scan to provide the signal of the data line Data1 to the top gate of T1, a TFT T3, controlled by the signal of the scan line Scan to provide the signal of the sense signal line Sense to the source of T1, a TFT T4, controlled by the signal of the scan line Scan to provide the signal of the data line Data2 to the bottom gate of T1, a capacitor C, a capacitor Cst, and an OLED D1.

The TFT T1 has a top gate connected to a node G, a bottom gate connected to a node B, and a source and a drain connected respectively to a high voltage power source VDD and a node S; T2 has a gate connected to the scan line Scan, a source and a drain connected respectively to the node G and a data line Data1; T3 has a gate connected to the scan line Scan, a source and a drain connected respectively to a sense signal line Sense and the node S; T4 has a gate connected to the scan line Scan, a source and a drain connected respectively to the node B and a data line Data2; capacitor C has two ends connected respectively to the node B and the high voltage power source VDD; capacitor Cst has two ends connected respectively to the node G and the node S; OLED D1 has an anode connected to the node S and a cathode connected to a low voltage power source VSS.

Figure 3:
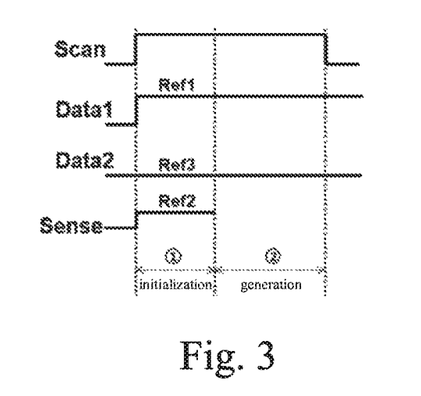
FIG. 3 is a schematic view showing the timing sequence of the AMOLED pixel driver circuit operating in a threshold voltage sense state of a preferred embodiment of the present invention.

Refer to FIG. 3. FIG. 3 is a schematic view showing the timing sequence of the AMOLED pixel driver circuit operating in a threshold voltage sense state of a preferred embodiment of the present invention. At this point, the scan line Scan is configured to input a high voltage; the data line Data1 is configured to input a reference voltage Ref1; the T1 threshold voltage sense state is divided into an initialization phase and a threshold voltage generation phase; the sense signal line Sense is configured to input a second reference voltage Ref2 in the initialization phase, and is configured as floating in the threshold voltage generation phase; the second reference voltage Ref2 is less than the first reference voltage Ref1 and is also less than an activation voltage of the OLED D1; the data line D2 is configured as a third reference voltage Ref3. For subsequent convenience, the third reference voltage is 0V.

In the initialization phase, the scan line Scam is at high voltage, and T2, T3, and T4 are turned on; Ref1 is written into the node G; Ref2 is written into the node S; Ref3 is written into the node B.

Figure 4:
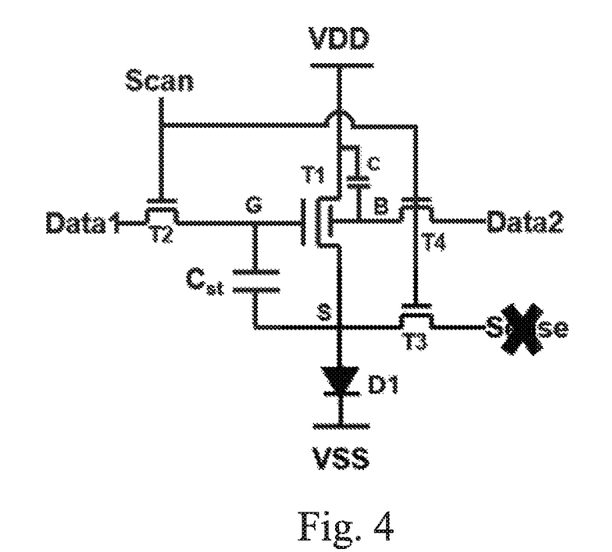
FIG. 4 is a schematic view showing the AMOLED pixel driver circuit operating in a threshold voltage generation phase of a preferred embodiment of the present invention.

Refer to FIG. 4. FIG. 4 is a schematic view showing the AMOLED pixel driver circuit operating in a threshold voltage generation phase of a preferred embodiment of the present invention. At this point, the sense line Sense is configured as floating. In the threshold voltage (Vth) generation phase, the scan line Scan maintains at high voltage, and T2, T3, and T4 are still turned on. By configuring the sense signal Sense from a peripheral sensing circuit or a chip as floating, due to the effect of VDD charging, the voltage level at the node S is raised to the difference between the first reference voltage Ref1 and T1 threshold voltage Vth, i.e., Ref1-Vth_T1. The T1 threshold voltage Vth is captured to the node S, the sense circuit can obtain the T1 threshold voltage Vth through voltage level at node S and the known Ref1. At this point, the voltage level at the node B is the third reference voltage Ref3.

For all pixels in a panel, the threshold voltage of the first TFT of each pixel in the panel is obtained and stored in a memory. According to the process sensing the T1 threshold voltage of a single pixel, the pixels of the entire panel is scanned line-by-line until the Vth of all pixels in the panel are sensed and stored in the memory.

Figure 5:
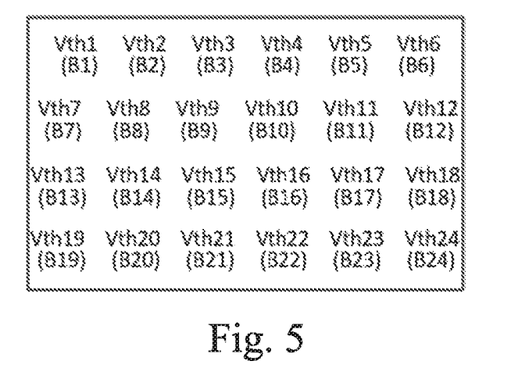
FIG. 5 is a schematic view showing the AMOLED pixel driver circuit obtaining the Vth-node B voltage level correspondence of a preferred embodiment of the present invention.

Refer to FIG. 5. FIG. 5 is a schematic view showing the AMOLED pixel driver circuit obtaining the Vth-node B voltage level correspondence of a preferred embodiment of the present invention. Based on the existing research, for the dual-gate TFT T1 shown in FIG. 2, the threshold voltage Vth can also be controlled through the bottom gate voltage level. For the preferred embodiment, the voltage level at the node B can control the threshold voltage Vth of T1. The Vth-node B voltage level correspondence can be obtained through actual measurement.

By reading from the memory the T1 Vth of all pixels in the panel sensed in the previous phase (threshold voltage generation phase), based on the Vth-node B voltage level correspondence, the correction value of the node B voltage level corresponding to the T1 Vth of each pixel is computed to obtain the Vth-node B voltage level correspondence shown in FIG. 5. The corresponding node B voltage level can pull the T1 Vth of all pixels in the panel to a same value. This same value can be achieved through a unified configuration in advance for all the pixels in the panel. In the compensation and light-emitting state, the node B voltage level can be written back to the data line Data2 as a compensation data, and a compensation signal is formed based on the compensation data for providing to T1 in subsequent light-emitting phase. For all pixels in the panel, the compensation signal for corresponding T1 of each pixel can be obtained for subsequent use.

Figure 6:
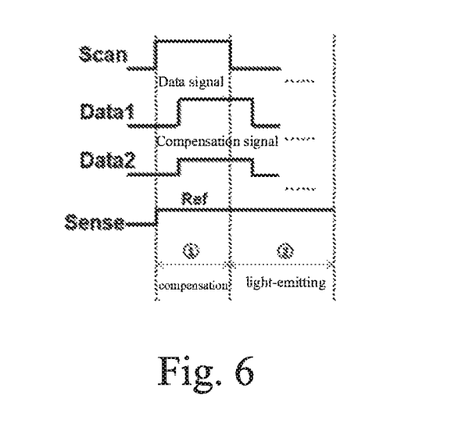
FIG. 6 is a schematic view showing the AMOLED pixel driver circuit operating in a threshold voltage compensation and light-emitting state of a preferred embodiment of the present invention.

Refer to FIG. 6. FIG. 6 is a schematic view showing the AMOLED pixel driver circuit operating in a threshold voltage compensation and light-emitting state of a preferred embodiment of the present invention. At this point, the T1 threshold voltage compensation and light-emitting state is divided into a compensation phase and a light-emitting phase; the scan line Scan is configured to input a high voltage in the compensation phase, and is configured to input a low voltage in the light-emitting phase; the data line Data1 is configured to input a data signal; the data line Data2 is configured to input the compensation signal; the sense signal line Sense is configured to input a fourth reference voltage Ref, and the fourth reference voltage Ref is less than the activation voltage of the OLED D1.

In the compensation phase (also called programming phase), the scan line Scan is at high voltage, and T2, T3 and T4 are turned on; the data signal of the current row is written into the node G; the compensation signal (from the aforementioned Vth sense state) is written into the node B and stored in the capacitor C; the fourth reference voltage (<D1 activation voltage) Ref is written into the node S; at this point, the voltage Vgs across the two ends of the storage capacitor Cst is equal to the data signal minus Ref (=data signal−Ref).

In the light-emitting phase, the scan line Scan is at low voltage, and T2, T3 and T4 are cut-off; the voltage levels at the nodes G and S are raised due to coupling effect. At this point, the Vgs of the capacitor Cst remains unchanged. D1 starts to emit light. Because the threshold voltage Vth of T1 of each pixel is corrected to the same level by the voltage level at the node B, the brightness uniformity is achieved and the T1 Vth variation is compensated.

The 4T2C pixel driver circuit of the present invention comprises, but not limited to, TFTs manufactured by low temperature polysilicon (LTPS) process, or oxide semiconductor process. Any variation of the TFT size, capacitance and timing sequence are also within the scope of the present invention.

In summary, the AMOLED pixel driver circuit of the present invention can effectively compensate the electric drifting of the driving TFT.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMOLED) pixel driver circuit, which comprises:
   a first TFT, acting as a driving TFT, with dual-gate structure, a top gate connected to a first node, a bottom gate connected to a second node, and a source and a drain connected respectively to a high voltage power source and a third node;
   a second TFT, having a gate connected to a scan line, a source and a drain connected respectively to the first node and a first data line;
   a third TFT, having a gate connected to the scan line, a source and a drain connected respectively to a sense signal line and the third node;
   a fourth TFT, having a gate connected to the scan line, a source and a drain connected respectively to the second node and a second data line;

a first capacitor, having two ends connected respectively to the second node and the high voltage power source;
a second capacitor, having two ends connected respectively to the first node and the third node;
an organic light-emitting diode (OLED), having an anode connected to the third node and a cathode connected to a low voltage power source.

2. The AMOLED pixel driver circuit as claimed in claim 1, wherein the first TFT, the second TFT, the third TFT, and the fourth TFT are all low temperature polysilicon (LTPS) TFTs, or oxide semiconductor TFTs.

3. The AMOLED pixel driver circuit as claimed in claim 1, wherein when the AMOLED pixel driver circuit operating in a first TFT threshold voltage sense state, the scan line is configured to input a high voltage; the first data line is configured to input a reference voltage; the first TFT threshold voltage sense state is divided into an initialization phase and a threshold voltage generation phase; the sense signal line is configured to input a second reference voltage in the initialization phase, and is configured as floating in the threshold voltage generation phase; the second reference voltage is less than the first reference voltage and is also less than an activation voltage of the OLED; the second data line is configured as a third reference voltage.

4. The AMOLED pixel driver circuit as claimed in claim 3, wherein the third reference voltage is 0V.

5. The AMOLED pixel driver circuit as claimed in claim 3, wherein in the threshold voltage generation phase, the third node is raised to a voltage level of a difference between the first reference voltage and threshold voltage of the first TFT, the threshold voltage of the first TFT is obtained through the voltage level of the third node, and at this point, the second node has a voltage level of the third reference voltage.

6. The AMOLED pixel driver circuit as claimed in claim 5, wherein for all pixels in a panel, the threshold voltage of the first TFT of each pixel in the panel is obtained and stored in a memory.

7. The AMOLED pixel driver circuit as claimed in claim 5, wherein a voltage level for the second node required for adjusting the threshold voltage of the first TFT a uniform setting for all pixels in the panel is obtained through corresponding relation between the threshold voltage of the first TFT and the voltage level of the second node; a compensation data is formed based on the voltage level of the second node, and a compensation signal is formed based on the compensation data.

8. The AMOLED pixel driver circuit as claimed in claim 7, wherein for all pixels in the panel, the compensation data corresponding to each pixel is respectively obtained.

9. The AMOLED pixel driver circuit as claimed in claim 1, wherein when the AMOLED pixel driver circuit operating in a first TFT threshold voltage compensation and light-emitting state, the first TFT threshold voltage compensation and light-emitting state is divided into a compensation phase and a light-emitting phase; the scan line is configured to input a high voltage in the compensation phase, and is configured to input a low voltage in the light-emitting phase; the first data line is configured to input a data signal; the second data line is configured to input the compensation signal; the sense signal line is configured to input a fourth reference voltage, and the fourth reference voltage is less than the activation voltage of the OLED.

10. An active matrix organic light-emitting diode (AMOLED) pixel driver circuit, which comprises:
a first TFT, acting as a driving TFT, with dual-gate structure, a top gate connected to a first node, a bottom gate connected to a second node, and a source and a drain connected respectively to a high voltage power source and a third node;
a second TFT, having a gate connected to a scan line, a source and a drain connected respectively to the first node and a first data line;
a third TFT, having a gate connected to the scan line, a source and a drain connected respectively to a sense signal line and the third node;
a fourth TFT, having a gate connected to the scan line, a source and a drain connected respectively to the second node and a second data line;
a first capacitor, having two ends connected respectively to the second node and the high voltage power source;
a second capacitor, having two ends connected respectively to the first node and the third node;
an organic light-emitting diode (OLED), having an anode connected to the third node and a cathode connected to a low voltage power source;
wherein the first TFT, the second TFT, the third TFT, and the fourth TFT being all low temperature polysilicon (LTPS) TFTs, or oxide semiconductor TFTs;
wherein when the AMOLED pixel driver circuit operating in a first TFT threshold voltage sense state, the scan line being configured to input a high voltage; the first data line being configured to input a reference voltage; the first TFT threshold voltage sense state being divided into an initialization phase and a threshold voltage generation phase; the sense signal line being configured to input a second reference voltage in the initialization phase, and configured as floating in the threshold voltage generation phase; the second reference voltage being less than the first reference voltage and also less than an activation voltage of the OLED; the second data line being configured as a third reference voltage;
wherein the third reference voltage being 0V;
wherein in the threshold voltage generation phase, the third node being raised to a voltage level of a difference between the first reference voltage and threshold voltage of the first TFT, the threshold voltage of the first TFT being obtained through the voltage level of the third node, and at this point, the second node having a voltage level of the third reference voltage.

11. The AMOLED pixel driver circuit as claimed in claim 10, wherein for all pixels in a panel, the threshold voltage of the first TFT of each pixel in the panel is obtained and stored in a memory.

12. The AMOLED pixel driver circuit as claimed in claim 10, wherein a voltage level for the second node required for adjusting the threshold voltage of the first TFT a uniform setting for all pixels in the panel is obtained through corresponding relation between the threshold voltage of the first TFT and the voltage level of the second node; a compensation data is formed based on the voltage level of the second node, and a compensation signal is formed based on the compensation data.

13. The AMOLED pixel driver circuit as claimed in claim 12, wherein for all pixels in the panel, the compensation data corresponding to each pixel is respectively obtained.

14. The AMOLED pixel driver circuit as claimed in claim 10, wherein when the AMOLED pixel driver circuit operating in a first TFT threshold voltage compensation and light-emitting state, the first TFT threshold voltage compensation and light-emitting state is divided into a compensation phase and a light-emitting phase; the scan line is configured to input a high voltage in the compensation phase, and is configured to input a low voltage in the light-emitting phase;

the first data line is configured to input a data signal; the second data line is configured to input the compensation signal; the sense signal line is configured to input a fourth reference voltage, and the fourth reference voltage is less than the activation voltage of the OLED.

\* \* \* \* \*